US009824899B2

(12) United States Patent
Shigeta et al.

(10) Patent No.: US 9,824,899 B2
(45) Date of Patent: Nov. 21, 2017

(54) ETCHING LIQUID FOR OXIDE CONTAINING ZINC AND TIN, AND ETCHING METHOD

(71) Applicant: MITSUBISHI GAS CHEMICAL COMPANY, INC., Tokyo (JP)

(72) Inventors: Mari Shigeta, Tokyo (JP); Kunio Yube, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 15/107,672

(22) PCT Filed: Dec. 16, 2014

(86) PCT No.: PCT/JP2014/083273
§ 371 (c)(1),
(2) Date: Jun. 23, 2016

(87) PCT Pub. No.: WO2015/104962
PCT Pub. Date: Jul. 16, 2015

(65) Prior Publication Data
US 2016/0329217 A1    Nov. 10, 2016

(30) Foreign Application Priority Data

Jan. 7, 2014    (JP) .................................. 2014-000847

(51) Int. Cl.
*H01L 21/465*    (2006.01)
*H01L 21/02*    (2006.01)
(Continued)

(52) U.S. Cl.
CPC ............ *H01L 21/465* (2013.01); *C09K 13/00* (2013.01); *C09K 13/06* (2013.01);
(Continued)

(58) Field of Classification Search
CPC ........... H01L 29/7869; H01L 21/02565; H01L 21/02554; H01L 21/32134; H01L 27/1225;
(Continued)

(56) References Cited

U.S. PATENT DOCUMENTS

2003/0164498 A1*    9/2003    Sung .................... G02F 1/13458
257/43
2007/0170434 A1*    7/2007    Inoue ...................... C04B 35/01
257/72
(Continued)

FOREIGN PATENT DOCUMENTS

JP        8-217578        8/1996
JP        2002-367974     12/2002
(Continued)

OTHER PUBLICATIONS

International Search Report issued in Japanese Patent Application No. PCT/JP2014/083273, dated Mar. 17, 2015.

*Primary Examiner* — Marvin Payen
*Assistant Examiner* — Jeremy Joy
(74) *Attorney, Agent, or Firm* — Greenblum & Bernstein, P.L.C.

(57) ABSTRACT

The present invention provides an etching liquid which has a suitable etching rate for etching of an oxide containing zinc and tin and is suppressed in change of the etching rate due to dissolution of the oxide, while being free from the generation of a precipitate. The corrosiveness of this etching liquid to wiring materials is low enough to be ignored, and this etching liquid has excellent linearity of a pattern shape. The present invention uses an etching liquid which contains (A) one or more substances selected from the group consisting of sulfuric acid, nitric acid, hydrochloric acid, methanesulfonic acid, perchloric acid and salts of these acids, and (Continued)

(B) oxalic acid or a salt thereof and water, and which has a pH of from −1 to 1.

11 Claims, 3 Drawing Sheets

(51) Int. Cl.
| | |
|---|---|
| *H01L 21/4757* | (2006.01) |
| *H01L 21/3213* | (2006.01) |
| *H01L 29/786* | (2006.01) |
| *H01L 31/18* | (2006.01) |
| *H01L 29/66* | (2006.01) |
| *C09K 13/00* | (2006.01) |
| *C09K 13/06* | (2006.01) |
| *H01L 27/12* | (2006.01) |

(52) U.S. Cl.
CPC .. *H01L 21/02554* (2013.01); *H01L 21/02565* (2013.01); *H01L 21/32134* (2013.01); *H01L 21/47573* (2013.01); *H01L 27/1225* (2013.01); *H01L 27/1259* (2013.01); *H01L 29/66* (2013.01); *H01L 29/7869* (2013.01); *H01L 31/1888* (2013.01); *H01L 29/66969* (2013.01); *Y02E 10/50* (2013.01)

(58) Field of Classification Search
CPC .............. H01L 29/786; H01L 21/4657; H01L 21/47573; C09K 13/06
See application file for complete search history.

(56) References Cited

U.S. PATENT DOCUMENTS

| | | | | |
|---|---|---|---|---|
| 2009/0075421 | A1* | 3/2009 | Chen | C09K 13/04 438/104 |
| 2010/0053523 | A1* | 3/2010 | Umeno | C01G 15/00 349/122 |
| 2010/0170696 | A1* | 7/2010 | Yano | C04B 35/453 174/126.2 |
| 2010/0330738 | A1* | 12/2010 | Uchiyama | C04B 35/453 438/104 |
| 2011/0049088 | A1* | 3/2011 | Matsubara | C09K 13/00 216/13 |
| 2014/0322861 | A1* | 10/2014 | Tsuda | H01L 31/022425 438/98 |

FOREIGN PATENT DOCUMENTS

| | | | | |
|---|---|---|---|---|
| JP | 2009-235438 | | | 10/2009 |
| JP | 2010-103214 | | | 5/2010 |
| JP | 2010103214 | A | * | 5/2010 |
| JP | 2010-248547 | | | 11/2010 |
| JP | 2013-084680 | | | 5/2013 |
| JP | 2013084680 | A | * | 5/2013 |
| WO | 2006/075506 | | | 7/2006 |
| WO | 2008/032728 | | | 3/2008 |

* cited by examiner

US 9,824,899 B2

ETCHING LIQUID FOR OXIDE CONTAINING ZINC AND TIN, AND ETCHING METHOD

TECHNICAL FIELD

The present invention relates to an etching liquid for an oxide containing at least zinc and tin used for a display device such as a liquid crystal display (LCD) or an electroluminescence display (LED), and to an etching method using the same.

BACKGROUND ART

While amorphous silicon and low-temperature polysilicon are widely used as a semiconductor layer of a display device such as a liquid crystal display or an electroluminescence display, various oxide semiconducting materials have been developed in the context of increase in the display size, realizing high precision, reduction in power consumption and the like.

An oxide semiconducting material may be, for example, an indium gallium and zinc oxide (IGZO), which has features such as high electron mobility and small leakage current. Besides IGZO, oxide semiconducting materials of various compositions such as an indium gallium oxide (IGO), a gallium zinc oxide (GZO), a zinc tin oxide (ZTO), an indium zinc tin oxide (IZTO) and an indium gallium zinc tin oxide (IGZTO) have been considered as oxide semiconducting materials that have better features.

In general, an oxide semiconducting material is formed as a thin film on a substrate such as glass using a film forming process such as a sputtering technique. Then, it is etched using a resist or the like as a mask to form an electrode pattern. This etching process may be a wet type (wet technique) or a dry type (dry technique), where the wet technique uses an etching liquid.

Among the oxide semiconducting materials, oxides containing at least zinc and tin are excellent in chemical resistance, and thus are stable even when they are exposed to various chemicals and gases during the film forming process and the etching process of other peripheral materials. On the other hand, however, oxides containing at least zinc and tin have a problem of having difficulty in fabrication by wet etching and the like.

When a pattern of an oxide semiconducting material is formed by wet etching, the etching liquid is required to have the following performances (1)-(5).

(1) It has a preferable etch rate (E.R.).
(2) Fluctuation in the etch rate as the oxide dissolves in the etching liquid is small. In other words, the etching liquid is stable and durable for long-term use and has a prolonged chemical solution life.
(3) It does not generate a precipitate when dissolving an oxide.
(4) It does not corrode peripheral materials such as wiring.
(5) The pattern shape (taper angle, linearity, residue removal performance) of the oxide semiconductor after the etching is good.

The etch rate of an oxide semiconducting material is preferably 10 nm/min or more, more preferably 20 nm/min or more, and still more preferably 30 nm/min or more. At the same time, it is preferably 10000 nm/min or less, more preferably 5000 nm/min or less, and still more preferably 2000 nm/min or less. Especially, it is preferably 10-10000 nm/min, more preferably 20-5000 nm/min, and still more preferably 30-2000 nm/min. When the etch rate is 10-10000 nm/min, high production efficiency can be maintained and the etching operation can be performed stably.

Furthermore, the oxide concentration in the etching liquid increases with etching. It is desirable that the decrease or change in the etch rate due to this is small. When the etching liquid is used to etch an oxide semiconductor layer, this is extremely important for realizing efficient industrial production.

Moreover, when a precipitate is generated in an etching liquid having an oxide semiconducting material dissolved therein, the precipitate may remain on the substrate as a residue after the etching treatment. This residue may induce generation of voids, adhesion failure, leakage or disconnection in the subsequent film forming process. As a result of which, characteristics as a display device could be deteriorated.

In addition, when a precipitate is generated in an etching liquid having an oxide semiconducting material dissolved therein, this precipitate may clog up a filter that is provided for circulating the etching liquid, whose replacement is cumbersome and may lead to high cost.

Therefore, even if the performance as an etching liquid is still remaining, the etching liquid needs to be discarded before the generation of such precipitate, resulting in shorter duration of use of the etching liquid and increase in the cost of the etching liquid. Additionally, cost for disposing waste liquid also increases.

For example, when zinc oxide is etched using an etching liquid containing oxalic acid, there is a major problem that an zinc oxalate precipitate as a solid matter. In a general etching liquid containing oxalic acid, a precipitate is generated when a concentration of the dissolved zinc becomes about 10 mass ppm (Comparative Examples 1 and 2).

Accordingly, it is desirable that a precipitate is not generated when zinc is dissolved in an etching liquid. A specific amount of dissolved zinc is preferably 10 mass ppm or more. More preferably it is 100 mass ppm or more, and particularly preferably it is 1000 mass ppm or more.

Although there is no upper limit, in order to perform a safe and stable etching operation, it is preferably 5000 mass ppm or less, more preferably 4000 mass ppm or less, and particularly preferably 3000 mass ppm or less.

Examples of a wiring material generally used for a display device such as a liquid crystal display include copper (Cu), aluminum (Al), molybdenum (Mo) and titanium (Ti). Since the etching liquid may possibly make contact with these wiring materials upon etching the oxide semiconducting material, corrosion of these wiring materials should preferably be ignorable or small. Specifically, the etch rate of the wiring material is preferably 3 nm/min or less, more preferably 2 nm/min or less, and still more preferably 1 nm/min or less.

The pattern shape of the oxide semiconductor after the etching specifically has a taper angle (an angle between the etched surface at the edge of the semiconductor layer and the surface of the underlying layer) of preferably 10°-80°. FIG. 5 is a schematic view showing cross-sectional observation of the semiconductor layer after the etching treatment. A semiconductor layer 2 and a resist 1 are laminated on an underlying layer 3, where the semiconductor layer 2 is patterned by using the resist 1. Here, the angle between the etched surface at the edge of the semiconductor layer and the surface of the underlying layer is referred to as a taper angle 4. The taper angle is more preferably 15°-75°, and particularly preferably 20°-70°. When the taper angle is larger than this range, there is a problem that the coverage with a layer laminated thereon will be poor. When the taper angle is smaller than this range (see FIG. 3), the linearity (the linear shape of the edge of semiconductor layer vertically seen from above) tends to be poor (see FIG. 4).

Furthermore, the pattern shape of the oxide semiconductor after the etching has a maximum linearity error of preferably 0.2 μm or less, more preferably 0.15 μm or less and still more preferably 0.1 μm or less. When the linearity is poor, an error of the width of the semiconductor layer is caused, which is unfavorable. FIG. 6 is a schematic view showing the top surface of the semiconductor layer vertically observed from above after the etching treatment and peeling off the resist. The view shows, in order from the left, the underlying layer 5, the tapered portion 6 of the semiconductor layer formed by the etching treatment and the semiconductor layer 7. The maximum value of an error 9 of the linearity (in the figure, indicated by a dotted line) of the border line 8 at the edge of the semiconductor layer patterned by the etching treatment is referred to as the "maximum linearity error".

Moreover, no residue (remainder or precipitates of oxide, etc.) is preferably generated on the underlying layer that has been removed of the etched oxide semiconductor layer (see FIG. 2).

As an etching liquid for ZTO, an etching liquid containing hydrochloric acid and nitric acid as primary components is known from Patent Literature 1.

Furthermore, Patent Literature 2 describes that ZTO can be etched with an aqueous organic acid solution such as oxalic acid or an aqueous inorganic acid solution such as those of halogen-based or nitric acid-based inorganic acid.

Moreover, Patent Literature 3 discloses an etching liquid characterized by a composition containing (a) oxalic acid, (b) a naphthalene sulfonate condensate or a salt thereof, (c) at least one of hydrochloric acid, sulfuric acid, water-soluble amine and salts thereof, and (d) water, which is used for etching an indium oxide-containing film.

Patent Literature 4 discloses an etching liquid characterized by a composition containing (a) oxalic acid, (b) hydrochloric acid and (c) a surfactant, as an etching liquid for a transparent conductive film having an indium tin oxide (ITO) and an indium zinc oxide (IZO) as primary components.

CITATION LIST

Patent Literature

Patent Literature 1: Specification of US Patent Application No. 2009/75421
Patent Literature 2: Japanese Unexamined Patent Application Publication No. 2010-248547
Patent Literature 3: International Publication No. 2008/32728
Patent Literature 4: Japanese Unexamined Patent Application Publication No. 2010-103214

SUMMARY OF INVENTION

Technical Problem

The etching liquid of Patent Literature 1, however, has a concern about corrosion of the wiring material (see Comparative Examples 3 and 4).

The etching liquid containing oxalic acid of Patent Literature 2 generates an oxalate precipitate (see Comparative Examples 1 and 2). In addition, an etching liquid that contains inorganic acid has a concern about corrosion of the wiring material (see Comparative Examples 3 and 4).

Patent Literatures 3 and 4 do not describe about characteristics of etching ZTO.

Under such circumstances, there is a need for providing an etching liquid that has a preferable etch rate upon etching an oxide containing zinc and tin, that has small decrease and change in the etch rate even when the oxide is dissolved, that no precipitate is generated upon dissolving the oxide, that corrosive nature on a wiring material such as aluminum, copper or titanium is small, and that linearity of the pattern shape is good.

Solution to Problem

Thus, the present invention was accomplished through keen studies to solve the above-described problems by finding out that said objective can be achieved by a treatment using an etching liquid for etching an oxide containing at least zinc and tin, the etching liquid comprising (A) one or more selected from the group consisting of sulfuric acid, nitric acid, hydrochloric acid, methanesulfonic acid, perchloric acid or salts thereof, and (B) oxalic acid or a salt thereof and water, wherein pH value is −1 to 1.

The present invention is as follows.
1. An etching liquid for etching an oxide containing at least zinc and tin, the etching liquid comprising:
    (A) one or more selected from the group consisting of sulfuric acid, nitric acid, hydrochloric acid, methanesulfonic acid, perchloric acid or salts thereof; and (B) oxalic acid or a salt thereof and water, wherein the pH value is −1 to 1.
2. The etching liquid according to Item 1, further comprising (C) carboxylic acid (other than oxalic acid).
3. The etching liquid according to Item 2, wherein (C) carboxylic acid is one or more selected from the group consisting of acetic acid, glycolic acid, malonic acid, maleic acid, succinic acid, malic acid, tartaric acid, glycine and citric acid.
4. The etching liquid according to any one of Items 1 to 3, further comprising a (D) polysulfonic acid compound.
5. The etching liquid according to Item 4, wherein the (D) polysulfonic acid compound is one or more selected from the group consisting of a naphthalene sulfonate formalin condensate and a salt thereof, polyoxyethylene alkyl ether sulfate, and polyoxyethylene alkyl phenyl ether sulfate.
6. The etching liquid according to any one of Items 1 to 5, further comprising (E) zinc at a concentration in a range of 10-5000 mass ppm.
7. The etching liquid according to any one of Items 1 to 6, wherein the taper angle of the etched pattern is 10°-80°.
8. A method for etching an oxide containing at least zinc and tin, comprising the step of bringing an etching liquid comprising (A) 0.5-30% by mass of one or more selected from the group consisting of sulfuric acid, nitric acid, methanesulfonic acid, hydrochloric acid, perchioric acid or salts thereof, and (B) 0.1-10% by mass of oxalic acid or a salt thereof and water (remainder), where pH value is −1 to 1, into contact with a substrate comprising the oxide containing at least zinc and tin.
9. The etching method according to Item 8, wherein the etching liquid further comprises 0.1-15% by mass of (C) carboxylic acid (other than oxalic acid).

Preferably, (C) carboxylic acid is one or more selected from the group consisting of acetic acid, glycolic acid, malonic acid, maleic acid, succinic acid, malic acid, tartaric acid, glycine and citric acid.

10. The etching method according to either one of Items 8 and 9, wherein the etching liquid further comprises 0.0001-10% by mass of a (D) polysulfonic acid compound.

Preferably, the (D) polysulfonic acid compound is one or more selected from the group consisting of a naphthalene sulfonate formalin condensate and a salt thereof, polyoxyethylene alkyl ether sulfate and polyoxyethylene alkyl phenyl ether sulfate.

11. The etching method according to any one of Items 8 to 10, wherein the etching liquid further comprises (E) zinc at a concentration in a range of 10-5000 mass ppm.
12. The etching method according to any one of Items 8 to 11, wherein the taper angle of the etched pattern is 10°-80°.
13. A display device produced by the method according to any one of Items 8 to 12.

Advantageous Effects of Invention

According to a preferable embodiment of the present invention, an etching liquid of the present application can be used for etching an oxide containing at least zinc and tin so that a preferable etching operation can be performed stably for a long period of time due to a preferable etch rate, an excellent pattern shape, small decrease or change in the etch rate when the oxide containing zinc and tin is dissolved in the etching liquid, no generation of a precipitate, and little corrosive nature on a wiring material, and beneficial effects such as excellent linearity of the etched pattern shape can be obtained.

DESCRIPTION OF EMBODIMENTS

Figure 1:
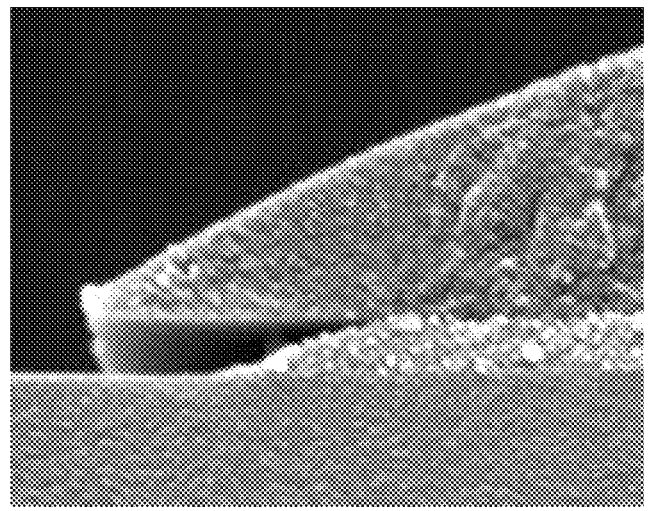
FIG. 1 A view of a cross-section of ZTO that was etched using the chemical solution of Example 2, observed with a scanning electron microscope (SEM).

An oxide containing zinc and tin of the present invention is not particularly limited as long as the oxide contains zinc and tin. It may also contain one or more elements other than zinc and tin.

The contents of zinc and tin in the oxide is each preferably 1% by mass or more, more preferably 3% by mass or more, and still more preferably 10% by mass or more. The content of metal elements other than zinc and tin are each preferably 10% by mass or less, more preferably 3% by mass or less, and still more preferably 1% by mass or less.

The etching liquid of the present invention comprises (A) one or more selected from the group consisting of sulfuric acid, nitric acid, hydrochloric acid, methanesulfonic acid, perchloric acid or salts thereof, and (B) oxalic acid or a salt thereof and water, where the pH value is −1 to 1.

An etching liquid of the present invention comprises, as (A), one or more selected from the group consisting of sulfuric acid, nitric acid, methanesulfonic acid, hydrochloric acid, perchloric acid or salts thereof Specifically, sulfuric acid, fuming sulfuric acid, ammonium sulfate, ammonium hydrogen sulfate, sodium hydrogen sulfate, potassium hydrogen sulfate, nitric acid, ammonium nitrate, methanesulfonic acid, hydrochloric acid and perchloric acid are preferable, sulfuric acid, nitric acid, methanesulfonic acid, hydrochloric acid and perchloric acid are more preferable, sulfuric acid, nitric acid and methanesulfonic acid are still more preferable, and sulfuric acid is particularly preferable. Furthermore, the concentration of an acid or a salt thereof selected as component (A) is preferably 0.5% by mass or more, more preferably 1% by mass or more, and still more preferably 2% by mass or more in terms of acid. At the same time, it is preferably 30% by mass or less, more preferably 20% by mass or less, and still more preferably 15% by mass or less. Especially, it is preferably 0.5-30% by mass, more preferably 1-20% by mass, and still more preferably 2-15% by mass. A good etch rate can be obtained when it is 0.5-30% by mass.

(B) Oxalic acid contained in the etching liquid of the present invention is not particularly limited as long as it is capable of supplying an oxalate ion. Moreover, the concentration of the oxalate ion selected as component (B) is preferably 0.1% by mass or more, more preferably 0.5% by mass or more, and still more preferably 1% by mass or more in terms of oxalic acid. At the same time, it is preferably 10% by mass or less, more preferably 7% by mass or less, and still more preferably 5% by mass or less. Especially, it is preferably 0.1-10% by mass, more preferably 0.5-7% by mass, and still more preferably 1-5% by mass. A good etch rate can be obtained when it is 0.1-10% by mass.

The water used in the present invention is preferably water that has been removed of metal ions, organic impurities, particles and the like by distillation, an ion-exchange treatment, a filter treatment, various adsorption treatments or the like. In particular, it is pure water, preferably ultrapure water. In addition, the concentration of water is preferably 10% by mass or more, more preferably 20% by mass or more, and still more preferably 30% by mass or more. In this case, the concentration of water is the remainder excluding the various agents.

The etching liquid of the present invention may further comprise, as (C), a carboxylic acid other than oxalic acid.

Specifically, a carboxylic acid is not particularly limited as long as it is capable of supplying a carboxylic acid ion (other than an oxalate ion). Carboxylic acid ion can enhance stability of a liquid composition for etching an oxide made of zinc and tin, and has a function of regulating the etch rate. For example, preferable examples include an aliphatic carboxylic acid with a carbon number of 1-18, an aromatic carboxylic acid with a carbon number of 6-10 as well as an amino acid with a carbon number of 1-10.

The aliphatic carboxylic acid with a carbon number of 1-18 is preferably formic acid, acetic acid, propionic acid, lactic acid, glycolic acid, diglycolic acid, pyruvic acid, malonic acid, butyric acid, hydroxybutyric acid, tartaric acid, succinic acid, malic acid, maleic acid, fumaric acid, valeric acid, glutaric acid, itaconic acid, caproic acid, adipic acid, citric acid, propanetricarboxylic acid, trans-aconitic acid, enanthic acid, caprylic acid, lauric acid, myristic acid, palmitic acid, stearic acid, oleic acid, linoleic acid, linolenic acid or a salt thereof.

Carboxylic acid is still more preferably acetic acid, glycolic acid, lactic acid, malonic acid, maleic acid, succinic acid, malic acid, tartaric acid, citric acid or a salt thereof, and particularly preferably acetic acid, maleic acid, malic acid and citric acid. These may also be used alone or more than one of them may be used in combination.

The concentration of (C) carboxylic acid (other than oxalic acid) or a salt thereof is preferably 0.1% by mass or more, more preferably 1% by mass or more, and still more preferably 3% by mass or more in terms of carboxylic acid. At the same time, it is preferably 15% by mass or less, more preferably 12% by mass or less, and still more preferably 10% by mass or less. Especially, it is preferably 0.1-15% by mass, more preferably 1-12% by mass, and still more preferably 3-10% by mass. Corrosion of a wiring material can be minimized when it is 1-15% by mass.

The pH value of the etching liquid of the present invention is in a range of −1 to 1. More preferable pH value is −0.7 to 0.7 and still more preferable pH value is −0.5 to 0.5.

The etching liquid of the present invention may also contain a pH adjuster, if necessary. The pH adjuster is not particularly limited as long as it does not affect the etching performance. Sulfuric acid or methanesulfonic acid that serves as component (A) or carboxylic acid (other than oxalic acid) that serves as component (C) can also be used for regulation. Furthermore, ammonia water or amidosulfuric acid can also be used as the pH adjuster.

If necessary, the etching liquid of the present invention may contain a polysulfonic acid compound as component (D). The polysulfonic acid compound is preferably a naphthalene sulfonate formalin condensate, a salt thereof, polyoxyethylene alkyl ether sulfate, polyoxyethylene alkyl phenyl ether sulfate or the like. A naphthalene sulfonate formalin condensate is commercially available under the trade names of DEMOL N (Kao Chemicals), Lavelin FP (Dai-ichi Kogyo Seiyaku), POLITY N100K (Lion Corporation) and the like.

The concentration of the polysulfonic acid compound (D) is preferably 0.0001% by mass or more, and still more preferably 0.001% by mass or more. At the same time, it is preferably 10% by mass or less or still more preferably 5% by mass or less. Especially, it is preferably in a range of 0.0001-10% by mass, and still more preferably, 0.001-5% by mass.

In a preferable embodiment of the present invention, the etching liquid of the present invention does not cause precipitation or change in the etching characteristics even when a zinc component is dissolved therein. If necessary, the etching liquid may contain zinc as component (E). Zinc has a function of further suppressing fluctuation in the etch rate upon dissolving the oxide containing zinc and tin. Zinc is not particularly limited as long as it can supply a zinc ion. Specifically, a salt such as zinc sulfate, zinc nitrate or zinc chloride may be used, or metal zinc, an oxide containing zinc and tin, or zinc oxide may be dissolved.

The concentration of (E) zinc is preferably 10 mass ppm or more, more preferably 100 mass ppm or more, and still more preferably 1000 mass ppm or more. At the same time, it is preferably 5000 mass ppm or less, more preferably 4000 mass ppm or less, and still more preferably 3000 mass ppm or less. Especially, it is preferably 10-5000 mass ppm, more preferably 100-4000 mass ppm, and still more preferably 1000-3000 mass ppm. Fluctuation of the etch rate can further be minimized when it is 10-5000 mass ppm.

Besides the above-described components, the etching liquid of the present invention may also contain various additives that are generally used in an etching liquid within a range that does not interfere with the effects of the etching liquid. For example, a solvent, a pH buffer or the like may be used.

According to the etching method of the present invention, a target to be etched is an oxide containing at least zinc (Zn) and tin (Sn). The content ratio of zinc to the total content of zinc and tin (atom ratio, calculated as Zn/(Zn+Sn)) is preferably, but not limited to, 0.3 or higher from the standpoint of the semiconductor characteristics.

The etching method of the present invention comprises the step of bringing the etching liquid of the present invention, that is, an etching liquid comprising (A) one or more selected from the group consisting of sulfuric acid, nitric acid, methanesulfonic acid, perchloric acid and salts thereof, and (B) oxalic acid or a salt thereof and water, wherein the pH value is −1 to 1, into contact with a target to be etched. According to the etching method of the present invention, generation of a precipitate can be prevented even when the etching operation is carried out continuously. In addition, since the change in the etch rate is small, the etching operation can stably be carried out for a long period of time.

According to the etching method of the present invention, the shape of the target to be etched is not limited, but it is preferably a thin film when it is used as a semiconducting material for a flat panel display. For example, a target to be etched may be obtained by forming a zinc tin oxide (ZTO) thin film on a silicon oxide insulating film, applying a resist thereon, transferring a desired pattern mask by exposure, and developing the resultant to form a desired resist pattern. When the target to be etched is a thin film, the thickness thereof is preferably in a range of 1-1000 nm, more preferably 5-500 nm, and particularly preferably 10-300 nm. Moreover, the target to be etched may have a lamination structure made of two or more oxide thin films of different compositions. In this case, the lamination structure having two or more oxide thin films of different compositions can be etched at once.

The contact temperature of the target to be etched and the etching liquid (i.e., the temperature of the etching liquid upon contact with the target to be etched) is preferably 10° C. or higher, more preferably 15° C. or higher, and still more preferably 20° C. or higher. At the same time, the contact temperature is preferably 70° C. or lower, more preferably 60° C. or lower, and still more preferably 50° C. or lower. Especially, the temperature is preferably 10-70° C., more preferably 15-60° C., and particularly preferably 20-50° C. A good etch rate can be obtained when the temperature is in a range of 10-70° C. Furthermore, an etching operation at the above-mentioned temperature range can suppress corrosion of the apparatus. While an increase in the temperature of the etching liquid increases the etch rate, a preferable treatment temperature may suitably be determined by also taking into account that evaporation of water or the like increases the change in the concentration of the etching liquid.

Although the etching time is not particularly limited in the etching method of the present invention, the just-etch time that takes until an oxide containing zinc (Zn) and tin (Sn) is completely etched to expose the underlayer is usually preferably about 0.01-30 minutes, more preferably 0.03-10 minutes, still more preferably 0.05-5 minutes, and particularly preferably 0.1-2 minutes.

A method for bringing the etching liquid into contact with the target to be etched is not particularly limited. For example, a common wet etching method such as a method in which an etching liquid is dropped (sheet-fed spin treatment), sprayed or the like to make contact with the targeted objected, or a method in which a targeted object is immersed in an etching liquid, can be employed.

EXAMPLES

Hereinafter, embodiments and effects of the present invention will specifically be described by way of Examples and Comparative Examples, although the present invention should not be limited to these examples.

Method for Measuring pH Value

Using HORIBA pH/ION meter, the electrode was immersed in an agitating etching liquid to measure the pH value at 22° C. The pH value of the pH measuring apparatus was adjusted using standard solutions at pH 2 and 7.

SEM Observation

An measurement instrument used for SEM observation was Hitachi field-emission scanning electron microscope S-5000H. Measurement conditions were as follows: accelerating voltage of 2.0 kV, extraction voltage of 4.2 kV, and emission current of 10 μA.

Preparation of Zinc Tin Oxide (ZTO) Thin Film/Glass Substrate

A zinc tin oxide target obtained by pulverizing, mixing and sintering zinc oxide and tin oxide was used to form a zinc tin oxide thin film at a zinc and tin atom ratio of 0.7 (film thickness: 100 nm) on a glass substrate by a sputtering technique.

Preparation of Resist Pattern/Zinc Tin Oxide Thin Film/Glass Substrate

A photoresist was deposited, exposed and developed on the above-described zinc tin oxide thin film to prepare a zinc tin oxide thin film having a resist pattern formed thereon.

Evaluation (Judgment)

1. Determination of Etch Rate

The etching liquids shown in Tables 1 and 2 were used to subject the zinc tin oxide (ZTO) thin film (film thickness 100 nm) formed on the glass substrate to etching treatments. In the etching treatment, the above-described ZTO film/glass substrate was immersed in an etching liquid kept at 35° C. for 20-60 seconds, followed by washing with pure water and drying. Next, the film thicknesses of the ZTO film before and after the etching treatment were measured using an optical film thickness measuring apparatus n & k Analyzer 1280 (n & k Technology Inc.). The difference between the film thicknesses was divided by the etching time to calculate the etch rate (early etch rate). Evaluation results were judged according to the criteria below.

E: Etch rate was 30 nm/min to 200 nm/min

G: Etch rate was 20 nm/min to less than 30 nm/min, or 201 nm/min to 500 nm/min

F: Etch rate was 10 nm/min to less than 20 nm/min, or 501 nm/min to 1000 nm/min

P: Etch rate was less than 10 nm/min, or 1001 nm/min or more In this regard, E, G and F were considered to be acceptable.

2. Confirmation of Oxide Solubility

A zinc tin oxide (ZTO) was dissolved in the etching liquids shown in Tables 1 and 2 to a predetermined concentration (10, 100 or 1000 mass ppm in terms of zinc concentration) so as to visually observe the presence of insoluble matters. Evaluation results were judged according to the criteria below.

E, G and F were considered to be acceptable.

E: Completely dissolved after the addition at a zinc concentration of 1000 mass ppm.

G: Completely dissolved after the addition at a zinc concentration of 100 mass ppm.

F: Completely dissolved after the addition at a zinc concentration of 10 mass ppm.

P: Presence of insoluble matter after the addition at a zinc concentration of 10 mass ppm.

3. Determination of Change in Etch Rate after Dissolving Oxide

After dissolving ZTO in the etching liquids shown in Tables 1 and 2 to a zinc concentration of 1000 mass ppm, the etch rates were determined by the same method as in Item 1. above. The amount of change in the etch rates before and after the ZTO dissolution was calculated. Evaluation results were expressed according to the criteria below.

E: Amount of change in etch rates was 5 nm/min or less

G: Amount of change in etch rates was over 5 nm/min to 10 nm/min or less

P: Amount of change in etch rates was over 10 nm/min

In this regard, E and G are considered to be acceptable.

4. Evaluation of Pattern Shape

A zinc tin oxide thin film (film thickness: 100 nm) having a resist pattern formed thereon was subjected to etching treatments using the etching liquids shown in Tables 1 and 2. The etching treatment was carried out at 35° C. employing a dip system. The etching time was twice the time (just-etch time) required for etching (100% over-etching condition). The just-etch time was calculated by dividing the film thickness of the ZTO film by the etch rate determined in "1. Determination of etch rate" (in the case of Example 2 below, just-etch time=ZTO film thickness 100 [nm]/etch rate 35 [nm/min]=2.857 [min]=171 seconds, and thus the treatment time of the 100% over-etching condition should be 171 seconds×2=342 seconds). The substrate after the etching was washed with water, blown with nitrogen gas to be dried, and observed with a scanning electron microscope ("S5000H model (model number)"; Hitachi) to judge the evaluation results according to the criteria below.

For each item, G was considered to be acceptable.

Taper Angle

G: Taper angle was 10-80°

P: Taper angle was 0 to less than 10°, or over 80°

Linearity

G: Linearity error was 0.2 μm or less

P: Linearity error was over 0.2 μm

Residue Removal Performance

G: Residue was absent

P: Residue was present

5. Determination of Etch Rate of Wiring Material (Corrosive Nature)

A copper (Cu)/titanium (Ti) laminated film, an aluminum (Al) monolayer film, a molybdenum (Mo) monolayer film and a Ti monolayer film formed on a glass substrate by sputtering technique was used to measure the etch rates of Cu, Al, Mo and Ti with the etching liquids shown in Tables 1 and 2. The etching treatment was carried out by immersing the above-described metal films/glass substrate in the etching liquids kept at 35° C. The film thicknesses of the metal films before and after the etching treatment were measured using an X-ray fluorescence spectrometer SEA1200VX (Seiko Instruments Inc.), and the difference between the film thicknesses was divided by the etching time to calculate the etch rate. Evaluation results were expressed according to the criteria below.

E: Etch rate was less than 1 nm/min

G: Etch rate was 1 nm/min to less than 2 nm/min

P: Etch rate was 2 nm/min or more

In this regard, E and G were considered to be acceptable.

Example 1

As component A, 14.3 g of 70% nitric acid (Wako Pure Chemical Industries) and 84.0 g of pure water were placed into a 100 ml polypropylene container. As component B, 1.7 g of oxalic acid (Wako Pure Chemical Industries) was further added. The resultant was agitated to thoroughly mix the components, thereby preparing an etching liquid (total weight of 100.0 g). The amount of nitric acid in the resulting etching liquid was 10% by mass while the amount of oxalic acid was 1.7% by mass. Additionally, pH value was −0.1.

This etching liquid was used to perform the above-described evaluations of Items 1-5. The results are summarized in Table 1.

The etch rate was 66 nm/min. When 2200 mass ppm (1000 mass ppm in terms of zinc concentration) of ZTO was added, the liquid remained transparent with no insoluble matter. The pH value was −0.1 and the etch rate was 61 nm/min after the addition of ZTO (1000 mass ppm in terms of zinc concentration). The amount of change was small (5 nm/min) and was judged E. The E.R. of the wiring material (Cu) was judged G, and Mo, Al and Ti were judged E.

Example 2

Figure 2:
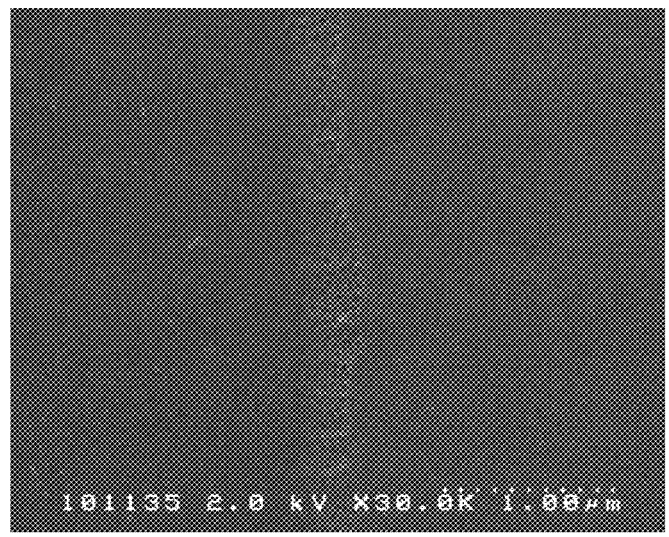
FIG. 2 A view of ZTO (right) and the glass substrate (left) after the etching treatment using the chemical solution of Example 2 and peeling off the resist, observed from above with SEM.

An etching liquid was prepared in the same manner as Example 1 except that 10% by mass of sulfuric acid was used instead of the nitric acid in Example 1. This etching liquid was used to conduct the above-described evaluations. The results are shown in Table 1. In addition, the results of the patterned shapes observed with SEM are shown in FIGS. 1 and 2. With reference to the cross-sectional view (FIG. 1), the taper angle was 25° and judged G, and with reference to the top view (the view of the pattern observed from above (FIG. 2)), the linearity and the residue removal performance were also judged G.

The cross-sectional view shown in the figure was obtained by cutting a substrate that had been patterned with a resist and observing the cross-section thereof. The top view was obtained by observing the wiring section (right) and the substrate (left) from above after peeling off the resist.

Examples 3-6

Etching liquids were prepared in the same manner as Example 1 except that 15% by mass of methanesulfonic acid (Example 3), 10% by mass of hydrochloric acid (Example 4), 7% by mass of sulfuric acid and 5% by mass of nitric acid (Example 5), or 10% by mass of sulfuric acid and 15% by mass of perchloric acid (Example 6) were used instead of the nitric acid in Example 1. These etching liquids were used to conduct the above-described evaluations. The results are shown in Table 1.

Example 7

An etching liquid was prepared in the same manner as Example 1 except that the concentrations of components A and B in Example 1 were doubled. This etching liquid was used to conduct the above-described evaluations. The results are shown in Table 1.

Example 8

An etching liquid was prepared in the same manner as Example 1 except that the nitric acid concentration was 10% by mass, the oxalic acid concentration was 1.7% by mass, and glycine as component C was 5% by mass. This etching liquid was used to conduct the above-described evaluations. The results are shown in Table 1.

Example 9

An etching liquid was prepared in the same manner as Example 1 except that the sulfuric acid concentration was 10% by mass, the oxalic acid concentration was 1.7% by mass, and the citric acid concentration as component C was 5% by mass. This etching liquid was used to conduct the above-described evaluations. The results are shown in Table 1.

Example 10

An etching liquid was prepared in the same manner as Example 1 except that the sulfuric acid concentration was 10% by mass, the oxalic acid concentration was 1.7% by mass and Lavelin FP (Dai-ichi Kogyo Seiyaku) was 0.1% by mass. This etching liquid was used to conduct the above-described evaluations. The results are shown in Table 1.

Comparative Examples 1 and 2

Etching liquids were prepared in the same manner as Example 1 except that the etching liquid had an oxalic acid concentration of 3.4% by mass (Comparative Example 1) or 1.7% by mass (Comparative Example 2). These etching liquids were used to conduct the above-described evaluations. The results are shown in Table 2.

Comparative Examples 3, 4 and 5

Figure 3:
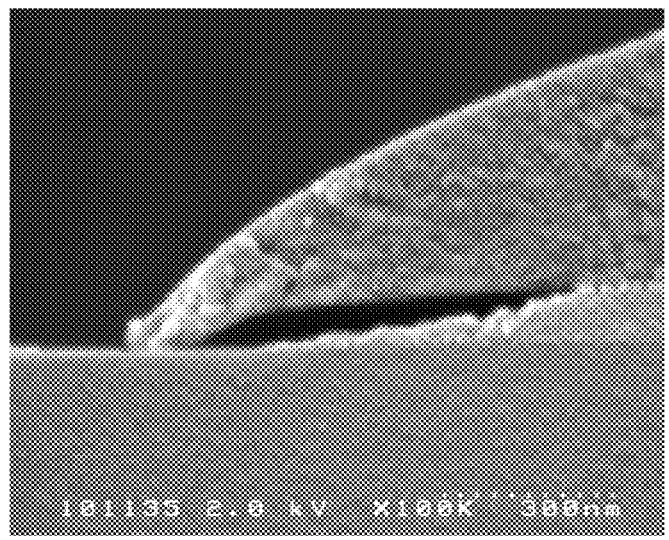
FIG. 3 A view of a cross-section of ZTO that was etched using the chemical solution of Comparative Example 3, observed with SEM.
Figure 4:
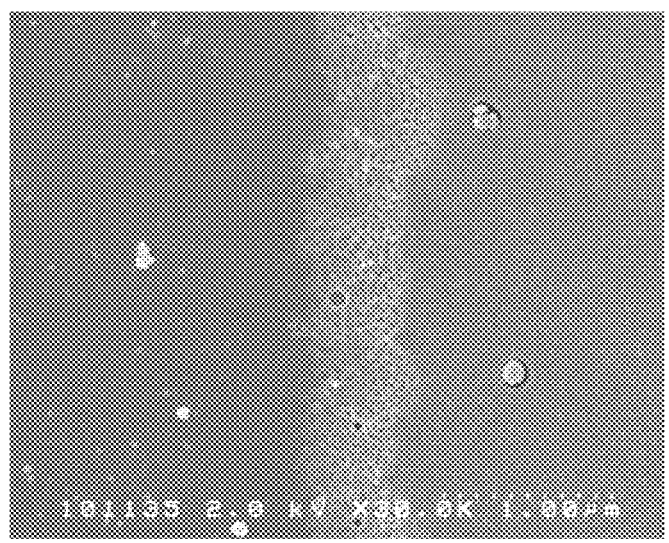
FIG. 4 A view of ZTO (right) and the glass substrate (left) after the etching treatment using the chemical solution of Comparative Example 3 and peeling off the resist, observed from above with SEM.
Figure 5:
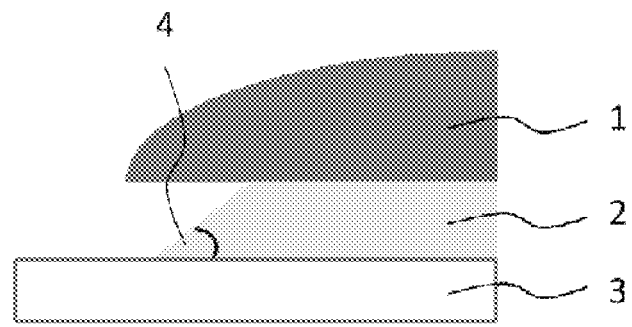
FIG. 5 A schematic view showing cross-sectional observation of the semiconductor layer after the etching treatment.
Figure 6:
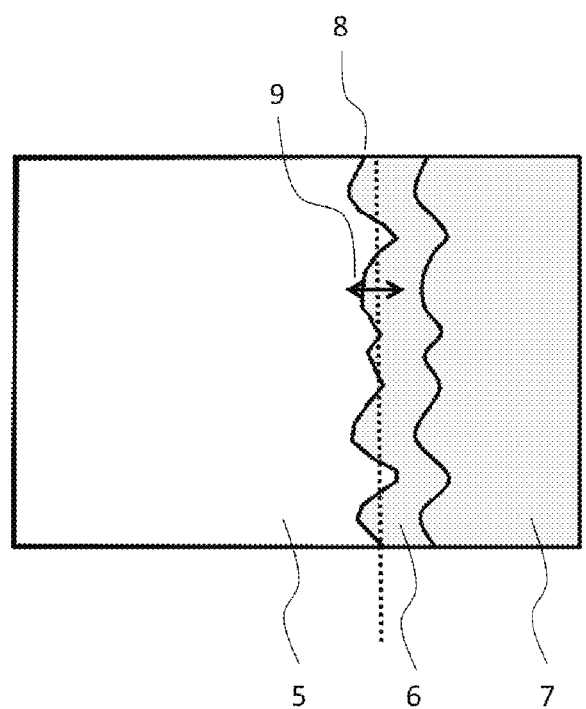
FIG. 6 A schematic view showing the top surface of the semiconductor layer after the etching treatment and peeling off the resist, vertically observed from above.

Etching liquids were prepared in the same manner as Example 1 except that the etching liquid had 10% by mass of hydrochloric acid (Comparative Example 3), 20% by mass of nitric acid (Comparative Example 4), or 10% by mass of maleic acid (Comparative Example 5). These etching liquids were used to conduct the above-described evaluations. The results are shown in Table 2. Moreover, the patterned shapes after the etching operation of Comparative Example 3 observed with SEM are shown in FIGS. 3 and 4. When 10% by mass of hydrochloric acid was used for patterning, the taper angle was 5° with reference to the cross-sectional view and thus judged P while the linearity was poor and the residue removal performance was insufficient with reference to the top view and thus judged P.

In view of Examples 1-10 above, the etching liquids of the present invention were found to be capable of etching an oxide containing zinc and tin at a preferable etch rate, and capable of performing an etching treatment with small change in the etch rate upon dissolving the oxide and with no generation of a precipitate. Moreover, corrosive nature on the wiring materials were small and the pattern shapes were excellent, revealing that they were etching liquids having performances excellent for industrial production.

On the other hand, in Comparative Examples 1-2 and 5, the abilities of the etching liquids to dissolve the zinc tin oxide (ZTO) were low (they could only dissolve the oxide for less than 10 mass ppm in terms of zinc concentration), and the amounts of change in the etch rates were unable to evaluate. Although the etch rates were relatively good in Comparative Examples 3 and 4, the etch rates of the wiring materials Cu, Mo and Al were large and corrosive nature was seen. In addition, the pattern shapes were also poor.

TABLE 1

| Example | Treated target | (A) | (B) Oxalic acid | Other components | (E) ZTO (in terms of zinc concentration) | pH | Etch rate [nm/min] | Early etch rate | Amount of change in etch rate |
|---|---|---|---|---|---|---|---|---|---|
| 1 | ZTO film | Nitric acid 10% | 1.7% | — | 0 ppm | −0.1 | 66 | E | E |
|  |  |  |  |  | 100 ppm | −0.1 | 63 |  |  |
|  |  |  |  |  | 1000 ppm | −0.1 | 61 |  |  |
| 2 | ZTO film | Sulfuric acid 10% | 1.7% | — | 0 ppm | 0.0 | 35 | E | E |
|  |  |  |  |  | 1000 ppm | 0.1 | 35 |  |  |
|  |  |  |  |  | 2000 ppm | 0.1 | 35 |  |  |
| 3 | ZTO film | Methanesulfonic acid 15% | 1.7% | — | 0 ppm | 0.4 | 60 | E | E |
|  |  |  |  |  | 1000 ppm | −0.0 | 60 |  |  |
|  |  |  |  |  | 2000 ppm | −0.0 | 60 |  |  |
| 4 | ZTO film | Hydrochloric acid 10% | 1.7% | — | 0 ppm | −0.5 | 24 | G | E |
|  |  |  |  |  | 1000 ppm | −0.4 | 24 |  |  |
| 5 | ZTO film | Sulfuric acid 7% Nitric acid 5% | 1.7% | — | 0 ppm | −0.0 | 43 | E | E |
|  |  |  |  |  | 1000 ppm | −0.0 | 43 |  |  |
| 6 | ZTO film | Sulfuric acid 10% Perchloric acid 15% | 1.7% | — | 0 ppm | −0.5 | 25 | G | E |
|  |  |  |  |  | 1000 ppm | −0.5 | 25 |  |  |
| 7 | ZTO film | Sulfuric acid 20% | 3.4% | — | 0 ppm | −0.3 | 35 | E | E |
|  |  |  |  |  | 1000 ppm | −0.2 | 28 |  |  |
| 8 | ZTO film | Nitric acid 10% | 1.7% | Glycine 5% | 0 ppm | 0.1 | 59 | E | E |
|  |  |  |  |  | 1000 ppm | −0.0 | 58 |  |  |
| 9 | ZTO film | Sulfuric acid 10% | 1.7% | Citric acid 5% | 0 ppm | 0.0 | 38 | E | E |
|  |  |  |  |  | 1000 ppm | 0.0 | 36 |  |  |
| 10 | ZTO film | Sulfuric acid 10% | 1.7% | Lavelin 0.1% | 0 ppm | 0.2 | 48 | E | E |
|  |  |  |  |  | 1000 ppm | 0.2 | 47 |  |  |

| Example | Solubility | Corrosive nature on wiring materials | | | | Taper angle | Linearity | Residue removal performance |
|---|---|---|---|---|---|---|---|---|
|  |  | Cu | Mo | Al | Ti |  |  |  |
| 1 | E | G | E | E | E | — | — | — |
| 2 | E | E | E | E | E | G | G | G |
| 3 | E | G | E | E | E | — | — | — |
| 4 | E | E | E | E | E | G | G | G |
| 5 | E | E | E | E | E | G | G | G |
| 6 | E | E | E | E | E | — | — | — |
| 7 | E | E | E | E | E | G | G | G |
| 8 | E | E | G | G | E | — | — | — |
| 9 | E | G | E | E | E | — | — | — |
| 10 | E | E | E | G | E | — | — | — |

—: represents "not added" or "not carried out"
ZTO film: Oxide thin film made of zinc, tin and oxygen
E: Excellent,
G: Good,
F: Fair,
P: Poor

TABLE 2

| Comparative Example | Treated target | (A) | (B) Oxalic acid | Other components | (E) ZTO (in terms of zinc concentration) | pH | Etch rate [nm/min] | Early etch rate | Amount of change in etch rate |
|---|---|---|---|---|---|---|---|---|---|
| 1 | ZTO film | — | 3.4% | — | 0 ppm | 1.0 | 117 | E | — |
|  |  |  |  |  | 100 ppm | Insoluble | — |  |  |
| 2 | ZTO film | — | 1.7% | — | 0 ppm | 1.1 | 76 | E | — |
|  |  |  |  |  | 1000 ppm | Insoluble | — |  |  |
| 3 | ZTO film | Hydrochloric acid 10% | — | — | 0 ppm | −0.3 | 18 | F | G |
|  |  |  |  |  | 1000 ppm | −0.4 | 18 |  |  |
| 4 | ZTO film | Nitric acid 20% | — | — | 0 ppm | −0.4 | 15 | F | G |
|  |  |  |  |  | 1000 ppm | −0.3 | 16 |  |  |
| 5 | ZTO film | — | — | Maleic acid 10% | 0 ppm | −0.8 | 4 | P | — |
|  |  |  |  |  | 1000 ppm | Insoluble | — |  |  |

TABLE 2-continued

| Example | Solubility | Corrosive nature on wiring materials | | | | Taper angle | Linearity | Residue removal performance |
|---|---|---|---|---|---|---|---|---|
| | | Cu | Mo | Al | Ti | | | |
| 1 | P | — | — | — | — | — | — | — |
| 2 | P | E | E | E | E | G | G | G |
| 3 | E | F | E | P | E | P | P | P |
| 4 | E | P | P | P | E | P | P | — |
| 5 | P | E | E | E | E | — | — | — |

—: represents "not added" or "not carried out"
ZTO film: Oxide thin film made of zinc, tin and oxygen
E: Excellent,
G: Good,
F: Fair,
P: Poor

INDUSTRIAL APPLICABILITY

An etching liquid of the present invention is capable of etching an oxide containing zinc and tin at a preferable etch rate, with small change in the etch rate upon dissolving the oxide, with no generation of a precipitate, and with small corrosive nature on the wiring material. Since the etching liquid of the present invention is expected to have a prolonged chemical solution life, it also has great benefits of reducing the cost for using the chemical solution, and largely reducing the environmental burden.

REFERENCE SIGNS LIST

1 Resist
2 Semiconductor layer
3 Underlying layer
4 Taper angle
5 Underlying layer
6 Tapered portion of semiconductor layer formed by etching treatment
7 Semiconductor layer
8 Border line at the edge of semiconductor layer patterned by etching treatment
9 Linearity error of semiconductor layer

The invention claimed is:

1. An etching liquid for etching an oxide containing at least zinc and tin, the etching liquid comprising:
(A) one or more selected from the group consisting of sulfuric acid, nitric acid, methanesulfonic acid, hydrochloric acid, perchloric acid or salts thereof; (B) oxalic acid or a salt thereof and water, and (E) zinc at a concentration in a range of 10-5000 mass ppm, wherein the pH value is −1 to 1.

2. The etching liquid according to claim 1, further comprising (C) carboxylic acid (other than oxalic acid).

3. The etching liquid according to claim 2, wherein (C) carboxylic acid is one or more selected from the group consisting of acetic acid, glycolic acid, malonic acid, maleic acid, succinic acid, malic acid, tartaric acid, glycine and citric acid.

4. The etching liquid according to Claim 1, further comprising a (D) polysulfonic acid compound.

5. The etching liquid according to claim 4, wherein the (D) polysulfonic acid compound is one or more selected from the group consisting of a naphthalene sulfonate formalin condensate and a salt thereof, polyoxyethylene alkyl ether sulfate, and polyoxyethylene alkyl phenyl ether sulfate.

6. The etching liquid according to claim 1, wherein a taper angle of an etched pattern is 10°-80°.

7. A method for etching an oxide containing at least zinc and tin, comprising bringing an etching liquid comprising (A) 0.5-30% by mass of one or more selected from the group consisting of sulfuric acid, nitric acid, methanesulfonic acid, hydrochloric acid, perchloric acid or a salt thereof, (B) 0.1-10% by mass of oxalic acid or a salt thereof and water (remainder), and (E) zinc at a concentration in a range of 10-5000 mass ppm, where pH value is −1 to 1, into contact with a substrate comprising the oxide containing at least zinc and tin.

8. The etching method according to claim 7, wherein the etching liquid further comprises 0.1-15% by mass of (C) carboxylic acid (other than oxalic acid).

9. The etching method according to claim 7, wherein the etching liquid further comprises 0.0001-10% by mass of a (D) polysulfonic acid compound.

10. The etching method according to claim 7, wherein a taper angle of an etched pattern is 10°-80°.

11. A display device produced by the method according to claim 7.

* * * * *